(12) United States Patent
Gartner et al.

(10) Patent No.: US 6,239,372 B1
(45) Date of Patent: May 29, 2001

(54) ELECTRICAL CONNECTION OF A MOVABLY DISPOSED ELECTRICAL COMPONENT WITH A FLEXIBLE, ELASTIC CONDUCTOR TRACK CARRIER

(75) Inventors: Bernhard Gartner, Stuttgart; Matthias Schnell, Winterbach; Joerg Wolke, Stuttgart; Peter Schaefer, Darmstadt-Eberstadt; Hans-Erich Steinmann, Rimbach; Guenter Trogisch, Seeheim-Jurgenheim, all of (DE)

(73) Assignees: Robert Bosch GmbH; Carl Freudenberg, both of Stuttgart (DE); a part interest ( * ) Notice: Subject to any disclaimer, the term of this patent is extended or adjusted under 35 U.S.C. 154(b) by 0 days.

(21) Appl. No.: 09/085,231

(22) Filed: May 27, 1998

(30) Foreign Application Priority Data

May 27, 1997 (DE) .............................. 197 22 006

(51) Int. Cl.⁷ .................................................. H02G 15/02
(52) U.S. Cl. .......................... 174/74 R; 174/76; 174/79; 174/81
(58) Field of Search ........................... 174/86, 87, 126.2, 174/76, 74 R, 84 R, 82

(56) References Cited

U.S. PATENT DOCUMENTS

| 3,937,870 | * | 2/1976 | Bumpstead et al. | ................... 174/87 |
| 4,075,420 | | 2/1978 | Walton | ................................. 174/117 |
| 4,350,909 | * | 9/1982 | Yamada | ................................. 310/62 |
| 4,626,721 | * | 12/1986 | Ouchi | ..................................... 310/71 |
| 4,715,928 | | 12/1987 | Hamby | ................................. 156/630 |
| 4,786,759 | * | 11/1988 | Gouverneur | ......................... 174/70 S |
| 5,035,637 | * | 7/1991 | Mathews et al. | ..................... 439/271 |
| 5,574,260 | * | 11/1996 | Broomal et al. | ................... 174/102 R |
| 5,589,666 | * | 12/1996 | DeCarlo et al. | ........................ 174/87 |
| 5,646,372 | * | 7/1997 | Sasaki et al. | ..................... 174/126.2 |

FOREIGN PATENT DOCUMENTS

| 0 513 263 B1 | 11/1991 | (EP) . |
| 1 117 124 | 5/1956 | (FR) . |

OTHER PUBLICATIONS

Design Guidelines For Flexible Circuits pp. 32, 33 and 34 Aug. 1955.

* cited by examiner

Primary Examiner—Dean A. Reichard
Assistant Examiner—William H. Mayo, III
(74) Attorney, Agent, or Firm—Ronald E. Greigg; Edwin E. Greigg

(57) ABSTRACT

An electrical connection in which a flexible, elastic conductor track carrier is affixed by a connecting end to an electrical component and embedded in potting compound. To prevent breakage at the fastening point at the transition from the potting compound to the outside, the conductor track carrier is reinforced with additional layers of insulating material.

7 Claims, 1 Drawing Sheet

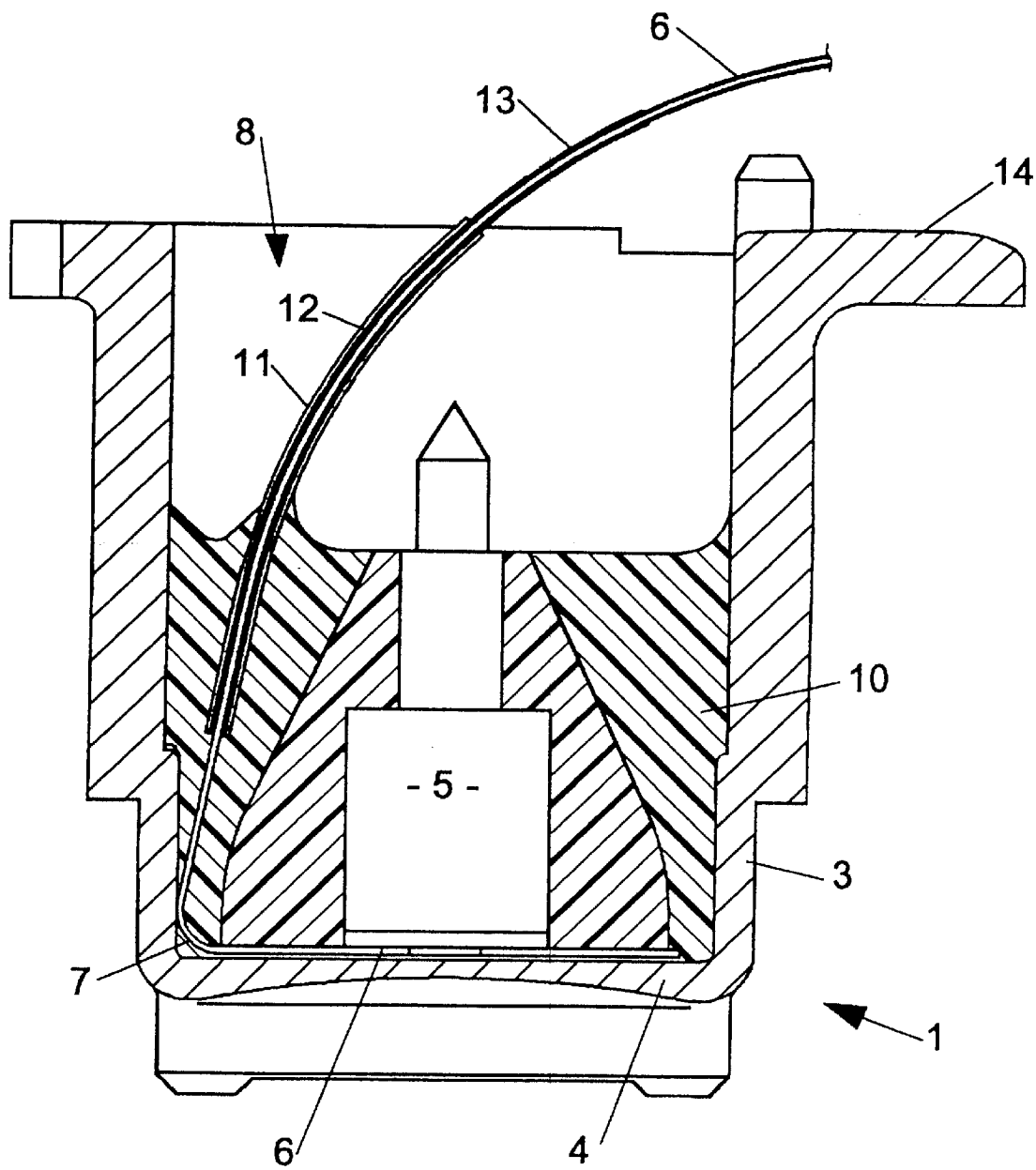

ELECTRICAL CONNECTION OF A MOVABLY DISPOSED ELECTRICAL COMPONENT WITH A FLEXIBLE, ELASTIC CONDUCTOR TRACK CARRIER

BACKGROUND OF THE INVENTION

The invention is based on an electrical connection of a movably disposed electrical component with a flexible, elastic conductor track carrier. In one such electrical connection, known from German Patent Application 19 63 76 26, provisions are made to protect the conductor track carrier, in its connection with the movable component, from impacts by embodying the conductor track carrier in loop-like fashion in predetermined regions at right angles to the plane of the conductor track carrier. In addition, at the point where the conductor track carrier is deflected into the interior, the conductor track carrier is fixed to a housing edge of the component, so that in the region where it is locally fixed inside this component, the conductor track carrier is no longer exposed to any movements. Nevertheless, from its fastening point on the housing of the movable component, the conductor track carrier is still exposed to vibrating or oscillating motions, which are more and more critical to the conductor track carrier, in terms of potential breakage of the conductor track carrier, the closer it is to the fixed fastening point.

OBJECT AND SUMMARY OF THE INVENTION

The disposition according to the invention of the electrical connection has the advantage over the prior art that no additional cap on the movable component is needed, and that in the region where the conductor track carrier is embedded in the movable component, it is essentially stabilized; this stabilization is then reduced at points that are increasingly distant from the embedding, and the situation then finally returns to the original elastic movability. Thus this conductor track carrier can be installed even in a loop having a change in direction of 180°, for example, while continuing to have the maximum possible radius of deflection.

In an advantageous refinement recited herein, the reinforcement of the conductor track carrier is multi-layered. Especially advantageously, the thickness of the multi-layered reinforcement decreases with increasing distance from the embedding in the electrical component. Moreover, a bending radius of the conductor track carrier can be limited, immediately adjacent where it is embedded in the electrical component, by the provision of a stop, preferably in the form of a part of the electrical component, that limits the bending distance of the elastic conductor track carrier. According to the invention, the embedding can take proper account of the fact of the actual later course of the conductor track carrier, by embedding the conductor track carrier in a preferential position.

The invention will be better understood and further objects and advantages thereof will become more apparent from the ensuing detailed description of a preferred embodiment taken in conjunction with the drawing.

BRIEF DESCRIPTION OF THE DRAWING

The sole FIGURE of the drawing is a sectional view through an angle encoder sensor.

DESCRIPTION OF THE PREFERRED EMBODIMENT

The drawing shows a section through an angle encoder sensor 1, of the kind used for instance in a distributor injection pump for supplying self-ignited internal combustion engines. This angle encoder sensor is moved constantly back and forth during operation in accordance with an injection onset adjustment. The signals it detects and carried onward via a conductor track carrier to a signal-processing device that is extended to the outside, from the interior of the fuel-filled housing of the distributor injection pump, in the manner described for instance in European Patent Disclosure EP-B1 0 513 263. The connection of the conductor track carrier with the electrical component, that is, the angle encoder sensor 1, is shown in the drawing. The angle encoder sensor has a cup-shaped housing 3, on whose bottom 4 the sensor element 5 is disposed. A conductor track carrier 6, which has conductor tracks for carrying sensor signals onward, is bonded to the sensor element in the region of the bottom. This conductor track carrier is flexible and is embodied elastically enough that it can be deflected even with short radii, as represented in the drawing by the deflection point 7. Captone, which has very good elastic properties, is used as the material for the conductor track carrier. From the bottom 4, the conductor track carrier is deflected toward the opening 8 of the sensor housing, transversely to the normal of the sensor housing, and then is extended in an arc to the outside. Only a portion of the course of this conductor track carrier is shown here. The interior of the cup-shaped housing 3 is sealed with a potting compound 10, which at the same time serves also to fix the conductor track carrier inside the housing 3. The housing is filled approximately halfway with a potting compound. Inside the embedding in this potting compound 10, the conductor track carrier 6 is reinforced. To that end, additional layers of the elastic carrier material are applied to the conductor track carrier, for instance by adhesive bonding. In the case contemplated, there are three layers 11, 12, and 13, which lying one on top of the other inside the embedding of the potting compound 10 reinforce the conductor track carrier. The layers are embodied such that the outermost layer 11 already ends just before or after where it emerges from the free, un-filled hollow space in the housing; the second layer ends after that along the onward course of the conductor track carrier 6, and the layer 13 ends after that. The result is substantial stabilization of the conductor track carrier, beginning in the potting compound 10 and in the ensuing course of the conductor track carrier, especially in this region in which, after emerging from the potting compound, it is deflected as well. Thus initially, where it emerges from its fastening point in the potting compound, it is provided with high stability, with somewhat reduced flexibility. In its further course, where not as high bending moments now act on the conductor track carrier, the reinforcement is then reduced. Consequently the conductor track carrier can even be carried in a generous loop back again 180° to where it emerged from the housing of the fuel injection pump, so that upon a transverse motion of the angle encoder sensor 1, the conductor track carrier at this deflection undergoes a rolling motion. The bending radius of the conductor track carrier where it emerges from the sensor housing 3 remains otherwise essentially constant.

As a result, a substantial stabilization is obtained, and the conductor track carrier is well secured against failing. In the remainder of its course, the conductor track carrier may even be embodied as quite thin, making it easier to lay and to lead through a housing seal.

For the sake of further stabilization, extreme bending of the conductor track carrier can be limited by the edge 14 of the sensor housing, or by some other stop. Thus a new bending point is created at this point and relieves the fastening point in the potting compound 10. The conductor track carrier is preferably extended, in a direction extending obliquely to the axis of the sensor housing, out of the potting compound 10 in a preferential direction to the direction of the onward course of the conductor track carrier. It is also in the region that the stop 14 is located.

The foregoing relates to a preferred exemplary embodiment of the invention, it being understood that other variants and embodiments thereof are possible within the spirit and scope of the invention, the latter being defined by the appended claims.

We claim:

1. An electrical connection of a movably disposed electrical component (1) with a flexible, elastic conductor track carrier (6), which comprises an elastic, load-bearing insulating film on which conductor tracks are disposed and with which conductor tracks an electrical connection is made between the component (1) and a second component, the movably disposed component being cup-shaped, with an outlet opening of which the conductor track carrier (6) leads away in such a manner that the conductor track carrier is bent transversely to a normal of the outlet opening (8) of the movable electrical component (1) and is guided in a bend across a fixed fastening point to the second component, the conductor track carrier is guided out of the interior of the movable electrical component (1) by an insulating potting compound (10), covering an inside surface of the opening, in which the conductor track carrier is reinforced along its length within the potting compound by at least one additional elastic, load-bearing insulating film reinforcements over a region that begins in the insulating potting compound and extends into a first bending region.

2. An electrical connection in accordance with claim 1, in which the reinforcements comprises a plurality of foils (11, 12, 13) stacked one above another.

3. An electrical connection in accordance with claim 2, in which all of the foils (11, 12, 13) serving as reinforcements begin in the region of the insulating potting compound (10) wherein the foils end, one foil after another, along an onward course of the conductor track carrier (6), so that after a thus-graduated reduction of the reinforcements, only an unreinforced conductor track carrier (6) that leads onward to a fastening point and to the second component finally remains.

4. An electrical connection in accordance with claim 3, in which the movable component (1) is embodied in such a way that the movable electrical component forms a cup edge (14), encompassing the opening (8), which limits any extreme bending of the conductor track carrier.

5. An electrical connection in accordance with claim 2, in which the movable component (1) is embodied in such a way that the movable electrical component forms a cup edge (14), encompassing the opening (8), which limits any extreme bending of the conductor track carrier.

6. An electrical connection in accordance with claim 1, in which the movable electrical component (1) is embodied in such a way that the movable electrical component forms a cup edge (14), encompassing the opening (8), which limits any extreme bending of the conductor track carrier.

7. An electrical connection in accordance with claim 1, in which the conductor track carrier is embedded in a preferential position that is eccentric to the axis of the movable component (1) or its opening (8) and thus is extended outward out of the insulating potting compound with an initial inclination to the axis of the electrical component (1).

* * * * *